US009564906B2

(12) United States Patent
Chang et al.

(10) Patent No.: US 9,564,906 B2
(45) Date of Patent: Feb. 7, 2017

(54) CAPACITANCE PHASE INTERPOLATION CIRCUIT AND METHOD THEREOF, AND MULTI-PHASE GENERATOR APPLYING THE SAME

(71) Applicant: INDUSTRIAL TECHNOLOGY RESEARCH INSTITUTE, Hsinchu (TW)

(72) Inventors: Chih-Hsiang Chang, Hsinchu (TW); Yu Lee, Baoshan Township (TW); Nai-Chen Cheng, Beidou Township (TW); Ching-Yuan Yang, Taichung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 1 day.

(21) Appl. No.: 14/532,887

(22) Filed: Nov. 4, 2014

(65) Prior Publication Data
US 2015/0365071 A1    Dec. 17, 2015

(30) Foreign Application Priority Data
Jun. 12, 2014    (TW) .............................. 103120318 A

(51) Int. Cl.
*H03H 11/16*        (2006.01)
*H03L 7/06*         (2006.01)
(Continued)

(52) U.S. Cl.
CPC ........ *H03L 7/06* (2013.01); *H03H 7/19* (2013.01); *H03H 7/21* (2013.01); *H03L 7/18* (2013.01); *H03L 7/0995* (2013.01)

(58) Field of Classification Search
USPC ........................................................ 327/231
See application file for complete search history.

(56) References Cited

U.S. PATENT DOCUMENTS 7,071,857 B2    7/2006  Bult et al.
7,102,404 B2    9/2006  Chansungsan
(Continued)

FOREIGN PATENT DOCUMENTS

CN    102208908 A    10/2011
TW    I313971 B       8/2009
(Continued)

OTHER PUBLICATIONS

Benyahia et al. "A digitally controlled 5GHz Analog Phase Interpolator with 10GHz LC PLL", IEEE, 2007, pp. 130-135.
(Continued)

*Primary Examiner* — Lincoln Donovan
*Assistant Examiner* — Patrick Chen
(74) *Attorney, Agent, or Firm* — Birch, Stewart, Kolasch & Birch, LLP

(57) ABSTRACT

A capacitance phase interpolation circuit including a first capacitance phase interpolation unit and a second capacitance phase interpolation unit is disclosed. The first capacitance phase interpolation unit includes a first capacitance group, wherein a plurality of capacitors in the first capacitance group are in a ring coupling, and the first capacitance phase interpolation unit receives a plurality of reference clock signals. The second capacitance phase interpolation unit is coupled to the first capacitance phase interpolation unit and includes a second capacitance group, wherein a plurality of capacitors in the second capacitance group are in a ring coupling, and each of the output clock signals is obtained via the first capacitance phase interpolation unit and the second capacitance phase interpolation unit by performing phase interpolation on all the reference clock signals.

18 Claims, 3 Drawing Sheets

(51) Int. Cl.
*H03L 7/18* (2006.01)
*H03H 7/19* (2006.01)
*H03H 7/21* (2006.01)
*H03L 7/099* (2006.01)

(56) References Cited

U.S. PATENT DOCUMENTS

| | | | |
|---|---|---|---|
| 7,375,596 | B2 | 5/2008 | Park et al. |
| 8,004,328 | B2 | 8/2011 | Kim et al. |
| 8,035,436 | B2 | 10/2011 | Ali et al. |
| 8,384,459 | B2 | 2/2013 | Hsu |
| 8,564,352 | B2 | 10/2013 | Agrawal et al. |
| 2001/0006544 | A1 | 7/2001 | Kawasaki et al. |
| 2014/0037035 | A1 | 1/2014 | Chung et al. |
| 2014/0086364 | A1* | 3/2014 | Schell .............. H03H 7/06 375/340 |

FOREIGN PATENT DOCUMENTS

| | | |
|---|---|---|
| TW | 201315155 A | 4/2013 |
| TW | 201316691 A | 4/2013 |
| TW | 201406050 A | 2/2014 |

OTHER PUBLICATIONS

Jee et al. "A 0.1-f(ref) BW 1GHz Fractional-N PLL with FIR-Embedded Phase-Interpolator-Based Noise Filtering", ISSCC 2011 / Session 5 / PLLs / 5.4.

Jiang et al. "A Compact Phase Interpolator for 3.125G Serdes Application", Cadence Design Systems, Inc., IEEE, 2003, pp. 249-252.

Kreienkamp et al. "A 10-Gb/s CMOS Clock and Data Recovery Circuit With an Analog Phase Interpolator", IEEE Journal of Solid-State Circuits, vol. 40, No. 3, Mar. 2005, pp. 736-743.

Kumaki et al. "A 0.5V 6-bit Scalable Phase Interpolator", IEEE, 2010, pp. 1019-1022.

Nicholson et al. "A 1.2V 2-bit Phase Interpolator for 65nm CMOS.", IEEE, 2012, pp. 2039-2042.

Sandner et al. "A 6-bit 1.2-GS/s Low-Power Flash-ADC in 0.13-μm Digital CMOS", IEEE Journal of Solid-State Circuits, vol. 40, No. 7, Jul. 2005, pp. 1499-1505.

Zanuso et al. "A Wideband 3.6 GHz Digital ΔΣ Fractional-N PLL With Phase Interpolation Divider and Digital Spur Cancellation", IEEE Journal of Solid-State Circuits, vol. 46, No. 3, Mar. 2011, pp. 627-638.

\* cited by examiner

CAPACITANCE PHASE INTERPOLATION CIRCUIT AND METHOD THEREOF, AND MULTI-PHASE GENERATOR APPLYING THE SAME

CROSS-REFERENCE OF RELATED APPLICATION

This application claims the benefit of Taiwan application Serial No. 103120318, filed Jun. 12, 2014, the disclosure of which is incorporated by reference herein in its entirety.

TECHNICAL FIELD

The disclosure relates in general to a capacitance phase interpolation circuit and a method thereof, and a multi-phase generator using the same.

BACKGROUND

Phase interpolation technology has been widely used in electronic devices, such as clock generator, testing machine and so on, for interpolating a plurality of output clock signals having different phases from a plurality of reference clock signals.

Normally, phase interpolation technology is used in a high-frequency operating environment, and thus factors, such as high-frequency noise interference, frequency offset and phase error, are taken into consideration. Of these factors, the phase error is normally caused by process variation.

Therefore, the present disclosure discloses a capacitance phase interpolation circuit and a method thereof capable of overcoming above factors to obtain required output clock signals.

SUMMARY

The disclosure is directed to a capacitance phase interpolation circuit, a method thereof, and a multi-phase generator using the same, wherein each of the output clock signals is obtained by performing phase interpolation on all the reference clock signals.

According to one embodiment, a capacitance phase interpolation circuit including a first capacitance phase interpolation unit and a second capacitance phase interpolation unit is disclosed. The first capacitance phase interpolation unit includes a first capacitance group, wherein a plurality of capacitors in the first capacitance group are in a ring coupling, and the first capacitance phase interpolation unit receives a plurality of reference clock signals. The second capacitance phase interpolation unit is coupled to the first capacitance phase interpolation unit and includes a second capacitance group, wherein a plurality of capacitors in the second capacitance group are in a ring coupling, and each of the output clock signals is obtained via the first capacitance phase interpolation unit and the second capacitance phase interpolation unit by performing phase interpolation on all the reference clock signals.

According to another embodiment, a capacitance phase interpolation method is disclosed. A plurality of reference clock signals are received by a first capacitance phase interpolation unit including a first capacitance group, wherein a plurality of capacitors in the first capacitance group are in a ring coupling. Interpolation is performed by the first capacitance phase interpolation unit and a second capacitance phase interpolation unit, wherein the second capacitance phase interpolation unit is coupled to the first capacitance phase interpolation unit and includes a second capacitance group, a plurality of capacitors in the second capacitance group are in a ring coupling, and each of the output clock signals is obtained by performing phase interpolation on all the reference clock signals.

According to an alternative embodiment, a multi-phase generator including a phase-locked loop, an interpolation circuit and a phase selector is disclosed. The phase-locked loop generates a first multi-phase output signal from a reference signal. The interpolation circuit is coupled to the phase-locked loop for obtaining a second multi-phase output signal by interpolating the first multi-phase output signal outputted from the phase-locked loop. The phase selector is coupled to the interpolation circuit for selecting at least a phase from the second multi-phase output signal.

Figure 1A:
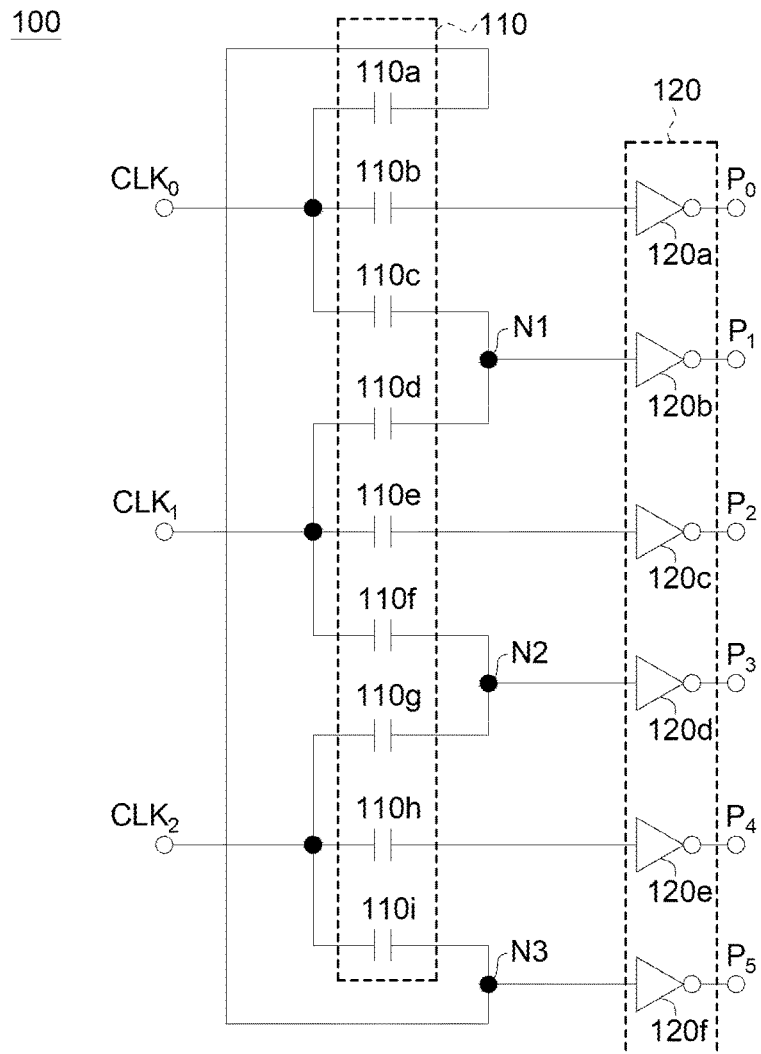
FIG. 1A is a circuit diagram of a capacitance phase interpolation circuit according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Technical terms of the disclosure are based on general definition in the technical field of the disclosure. If the disclosure describes or explains one or some terms, definition of the terms is based on the description or explanation of the disclosure. The common technology or theory in the field of the disclosure is not described in details if it does not involve the features of the disclosure. Further, shapes, sizes and ratios of the objects are exemplary for one skilled person in the art to understand the disclosure, not to limit the disclosure.

Each of the disclosed embodiments has one or more technical features. In possible implementation, one skilled person in the art would selectively implement part or all technical features of any embodiment of the disclosure or selectively combine part or all technical features of the embodiments of the disclosure.

Referring to FIG. 1A, a circuit diagram of a capacitance phase interpolation circuit according to an embodiment of the present disclosure is shown. As indicated in FIG. 1A, the capacitance phase interpolation circuit 100 according to the embodiment of the present disclosure includes a first capacitance phase interpolation unit 110 and a buffer unit 120. The first capacitance phase interpolation unit 110 includes a plurality of capacitors 110a~110i (also referred as a first capacitance group), wherein each of the capacitors 110a~110i has equivalent capacitance. The buffer unit 120 includes a plurality of phase inverters 120a~120f, wherein each of the phase inverters 120a~120f basically has equivalent circuit structure.

The capacitor 110a has two ends: one is coupled to a first reference clock $CLK_0$, and the other is coupled to the capacitor 110i.

The capacitor 110b has two ends: one is coupled to the first reference clock $CLK_0$, and the other is coupled to the phase inverter 120a of the buffer unit 120.

The capacitor 110c has two ends: one is coupled to the first reference clock $CLK_0$, and the other is coupled to the phase inverter 120b of the buffer unit 120.

The capacitor 110d has two ends: one is coupled to a second reference clock $CLK_1$, and the other is coupled to the phase inverter 120b of the buffer unit 120. Or, the capacitors 110c and 110d are serially coupled between the first reference clock signal $CLK_0$ and the second reference clock signal $CLK_1$ of the reference clock signals, wherein the capacitors 110c and 110d together are coupled to the phase inverter 120b.

The capacitor 110e has two ends: one is coupled to the second reference clock $CLK_1$, and the other is coupled to the phase inverter 120c of the buffer unit 120.

The capacitor 110f has two ends: one is coupled to the second reference clock $CLK_1$, and the other is coupled to the phase inverter 120d of the buffer unit 120.

The capacitor 110g has two ends: one is coupled to a third reference clock $CLK_2$, and the other is coupled to the phase inverter 120d of the buffer unit 120.

The capacitor 110h has two ends: one is coupled to the third reference clock $CLK_2$, and the other is coupled to the phase inverter 120e of the buffer unit 120.

The capacitor 110i has two ends: one is coupled to the third reference clock $CLK_2$, and the other is coupled to the phase inverter 120f of the buffer unit 120.

The phase inverter 120a is coupled to the capacitor 110b for inverting the first reference clock CLK0 to a first output clock signal $P_0$.

The phase inverter 120b is coupled to the capacitors 110c and 110d. Since the second ends of the capacitors 110c and 110d are coupled to a node N1, the signal at the node N1 is an interpolation result of the first reference clock $CLK_0$ and the second reference clock $CLK_1$. Therefore, the phase inverter 120b inverts the signal at the node N1 to a second output clock signal $P_1$.

The phase inverter 120c is coupled to the capacitor 110e for inverting the second reference clock CLK1 to a third output clock signal $P_2$.

The phase inverter 120d is coupled to the capacitors 110f and 110g. Since the second ends of capacitors 110f and 110g are coupled to a node N2, the signal at the node N2 is an interpolation result of the second reference clock $CLK_1$ and the third reference clock $CLK_2$. Therefore, the phase inverter 120d inverts the signal at the node N2 to a fourth output clock signal P3.

The phase inverter 120e is coupled to the capacitor 110h for inverting the third reference clock $CLK_2$ to a fifth output clock signal $P_4$.

The phase inverter 120f is coupled to the capacitors 110i and 110a. Since the second ends of capacitors 110i and 110a are coupled to a node N3, the signal at the node N3 is an interpolation result of the third reference clock $CLK_2$ and the first reference clock $CLK_0$. Therefore, the phase inverter 120f inverts the signal at the node N3 to a sixth output clock signals $P_5$.

Signals at the nodes N1, N2 and N3 are referred as intermediate signals; and signals between capacitors and their associated phase inverters are also referred as intermediate signals.

As indicated in FIG. 1A, the capacitance phase interpolation circuit 100 obtains six output clock signals by performing phase interpolation on three reference clock signals, wherein three output clock signals among the six output clock signals are inverse signals of the three reference clock signals, and the other three output clock signals are inverse signals of three intermediate signals obtained by performing phase interpolation on every two of the three reference clock signals.

As indicated in FIG. 1A, each signal path for generating output clock signal includes one single phase inverter. However, anyone who is skilled in the technology field of the present disclosure shall understand that the signal path may include two or more than two phase inverters (that is, one or more than one phase inverters is serially coupled to the phase inverter 120a, and such design is still within the spirit of the present disclosure.

In addition, the one or more than one phase inverter of each signal path for generating output clock signal may be used for adjusting the level of the output clock signal, and such design is still within the spirit of the present disclosure.

Besides, the capacitors 110a~110i of the first capacitance phase interpolation unit 110 may be regarded as ring coupling because the first capacitor 110a is coupled to the last capacitor 110i. That is, the capacitors are either directly coupled or indirectly coupled. Moreover, among the capacitors 110a~110i, the capacitors 110a, 110c, 110d, 110f, 110g and 110i are serially coupled to each other.

Figure 1B:
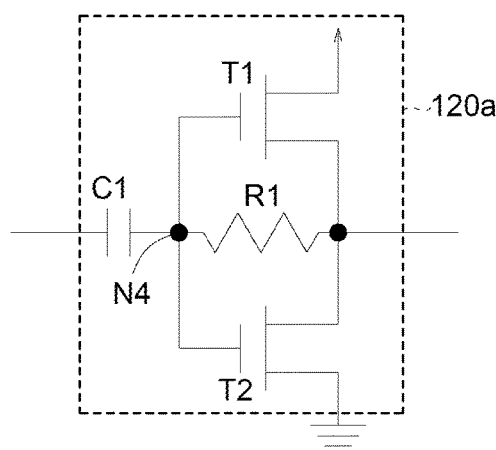
FIG. 1B is a detailed circuit diagram of a phase inverter.

FIG. 1B is a detailed circuit diagram of the phase inverter 120a. As indicated in FIG. 1B, the phase inverter 120a includes a capacitor C1, a resistor R1, and transistors T1 and T2. The capacitor C1 is coupled between an input end and a node N4. The capacitor C1, the resistor R1, the transistor T1 and T2 are coupled to the node N4. The resistor R1 is coupled between the node N4 and an output node. The transistor T1 is coupled to the node N4, a voltage supply (not illustrated) and the output node. The transistor T2 is coupled to the node N4, a ground end and the output node. Descriptions of the operations of the elements of the phase inverter 120a are omitted here.

Figure 2:
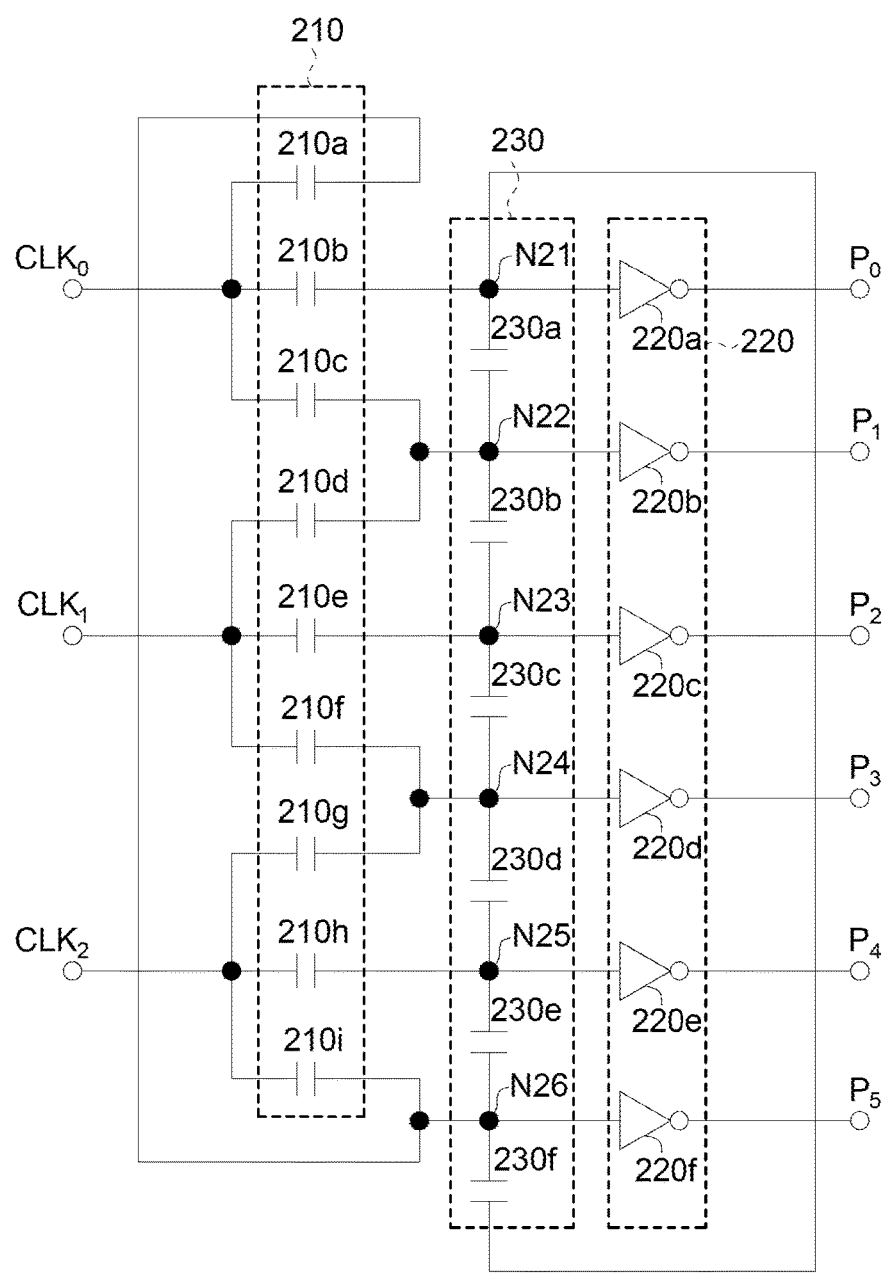
FIG. 2 is a circuit diagram of a capacitance phase interpolation circuit according to another embodiment of the present disclosure.

Referring to FIG. 2, a circuit diagram of a capacitance phase interpolation circuit according to another embodiment of the present disclosure is shown. As indicated in FIG. 2, the capacitance phase interpolation circuit 200 includes a first capacitance phase interpolation unit 210, a buffer unit 220 and a second capacitance phase interpolation unit 230. The first capacitance phase interpolation unit 210 includes a plurality of capacitors 210a~210i. The buffer unit 220 includes a plurality of phase inverters 220a~220f. The second capacitance phase interpolation unit 230 includes a plurality of capacitors 230a~230f (also referred as a second capacitance group), wherein each of the capacitors 230a~230f has equivalent capacitance, and the capacitors 230a~230f are serially coupled. The structures and operations of the first capacitance phase interpolation unit 210 and the buffer unit 220 are identical or similar to that illustrated in FIG. 1A, and specific descriptions are omitted here.

The structures and operations of the second capacitance phase interpolation unit 230 are disclosed below. The capacitor 230a has two ends respectively coupled to nodes N21 and N22. The capacitors 210b, 230a and 230f together with the phase inverter 220a are coupled to the node N21.

The capacitors 210c, 210d, 230a and 230b together with the phase inverter 220b are coupled to the node N22.

The capacitor 230b has two ends respectively coupled to nodes N22 and N23. The capacitors 210e, 230b and 230c together with the phase inverter 220c are coupled to the node N23.

The capacitor 230c has two ends respectively coupled to nodes N23 and N24. The capacitors 210f, 210g, 230c, and 230d together with the phase inverter 220d are coupled to the node N24.

The capacitor 230d has two ends respectively are coupled to node N24 and N25. The capacitors 210h, 230d, and 230e together with the phase inverter 220e are coupled to the node N25.

The capacitor 230e has two ends respectively coupled to node N25 and N26. The capacitors 210i, 210a, 230e, and 230f together with the phase inverter 220f are coupled to the node N26.

The capacitor 230f has two ends respectively coupled to node N26 and N21.

The coupling relationship between the capacitors 230a~230f is referred as "ring" coupling. That is, anyone of the capacitors 230a~230f may be coupled to anyone of the capacitors 230a~230f. For example, the capacitor 230a may be coupled to the capacitor 230d via the capacitors 230b and 230c.

Details of interpolation are disclosed below. In the embodiment illustrated in FIG. 2, the coupling relationship between the capacitors 230a~230f of the second capacitance phase interpolation unit 230 is ring coupling. During interpolation, each output clock signal is obtained by performing phase interpolation on each reference clock signal (that is, each input signal) and all the other output clock signals. Or, each output clock signal is obtained by performing phase interpolation on all the reference clock signals. Let the first output clock signal $P_0$ be taken for example. The phase inverter 220a inverts the signal at the node N21 to obtain the first output clock signal $P_0$. As for the node N21, the first reference clock $CLK_0$ may be coupled to the node N21 via the capacitor 210b; the second reference clock $CLK_1$ may be coupled to the node N21 via the capacitors 210d and 230a; and the third reference clock $CLK_2$ may be coupled to the node N21 via the capacitors 210i, 210a and 210b. Moreover, the second output clock signal $P_1$ (that is, the signal at the node N22) may be coupled to the node N21 via the capacitor 230a; the third output clock signal $P_2$ (that is, the signal at the node N23) may be coupled to the node N21 via the capacitors 230a and 230b; the fourth output clock signal $P_3$ (that is, the signal at the node N24) may be coupled to the node N21 via the capacitors 230a, 230b and 230c (or, via the capacitors 230d, 230e and 230f); the fifth output clock signal $P_4$ (that is, the signal at the node N25) may be coupled to the node N21 via the capacitors 230e and 230f; and the sixth output clock signals $P_5$ (that is, the signal at the node N26) may be coupled to the node N21 via the capacitor 230f.

As indicated in FIG. 1A, $P_0=CLK_0$, $P_1=N1=(CLK_0+CLK_1)$, $P_2=CLK_1$, $P_3=N2=(CLK_1+CLK_2)$, $P_4=CLK_2$, $P_5=N3=(CLK_2+CLK_0)$, wherein $P_1$ is an interpolation result of $CLK_0$ and $CLK_1$, $P_3$ is an interpolation result of $CLK_1$ and $CLK_2$, and $P_5$ is an interpolation result of $CLK_2$ and $CLK_1$.

As indicated in FIG. 2, $P_0=N21=(N22+N26+CLK_0)$, $P_1=N22=(N21+N23+CLK_0+CLK_1)$, $P_2=N23=(N22+N24+CLK_1)$, $P_3=N24=(N23+N25+CLK_1+CLK_2)$, $P_4=N25=(N24+N26+CLK_2)$, $P_5=N26=(N25+N21+CLK_2+CLK_0)$, wherein $P_0$ is an interpolation result of N22, N26 and $CLK_0$, $P_1$ is an interpolation result of N21, N23, $CLK_0$ and $CLK_1$, $P_2$ is an interpolation result of N22, N24 and $CLK_1$, $P_3$ is an interpolation result of N23, N25, $CLK_1$ and $CLK_2$, $P_4$ is an interpolation result of N24, N26 and $CLK_2$, and $P_5$ is an interpolation result of N25, N21, $CLK_2$ and $CLK_0$.

Or, in the present embodiment of the disclosure, a plurality of capacitors are used for generating a plurality of the intermediate signals (for example, the signals at the nodes N21, N23 and N25 of FIG. 2). Then, the capacitors are further used for generating output clock signals from the intermediate signals.

In FIG. 1A and FIG. 2, six output clock signals are obtained by performing interpolation on three reference clock signals. Based on the above description, anyone who is skilled in the technology field of the disclosure will understand that in other possible embodiments, n output clock signals may be obtained by performing interpolation on m reference clock signals, wherein m and n are positive integers which are set as n=2m under normal circumstances.

In addition, the levels of the output clock signals are determined according to the operating voltages of the buffer units 120 and 220. Therefore, the levels of the output clock signals may be adjusted by adjusting the operating voltages of the buffer unit 120 and 220. That is, the circuit structures as illustrated in FIG. 1A and FIG. 2 according to the embodiment of the present disclosure may also be used as level shifters.

Figure 3:
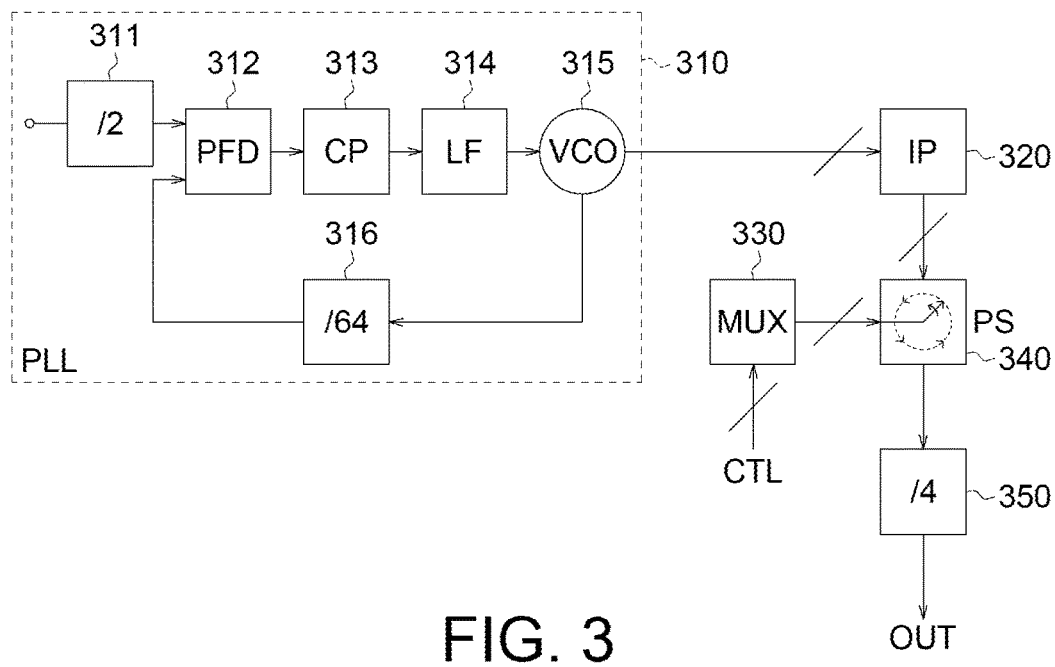
FIG. 3 is a functional block diagram of a multi-phase generator according to an alternate embodiment of the present disclosure.

Besides, a multi-phase generator is disclosed in other embodiment of the present disclosure. As indicated in FIG. 3, the multi-phase generator 300 includes a phase-locked loop (PLL) 310, an interpolation circuit (IP) 320, a phase selector (PS) 330, a multiplexer (MUX) 340 and a divide-by-4 circuit 350.

The phase-locked loop 310 may provide a multi-phase output signal. Exemplarily but not restrictively, the phase-locked loop 310 may provide an 8-phase output signal, and the phase-locked loop 310 is operated under a high-frequency operating environment of 160 picoseconds. The phase difference between the phases of the 8-phase output signal of the phase-locked loop 310 is 20 ps.

The phase-locked loop 310 includes a divide-by-2 circuit 311, a phase and frequency detector (PFD) 312, a charge pump (CP) 313, a low-pass filter (LF) 314, a voltage controlled oscillator (VCO) 315 and a divide-by-64 circuit 316.

The divide-by-2 circuit 311 divides the reference signal (for example, 200 MHz) by 2. The phase and frequency detector 312 detects the phase and frequency of the output signal of the divide-by-2 circuit 311 and that of the output signal of the divide-by-64 circuit 316. The charge pump 313 outputs a control signal according to the detection result obtained by the phase and frequency detector 312. The control signal, after filtered by the low-pass filter 314, controls the output signal of the voltage controlled oscillator 315. The output signal of the voltage controlled oscillator 315 is outputted to the phase selector 320 and the divide-by-64 circuit 316. The structure and operation of the phase-locked loop 310 are not subjected to specific restrictions here.

The interpolation circuit 320 may be realized by the capacitance phase interpolation circuit of either of two embodiments above disclosed. The interpolation circuit 320 may perform interpolation on the 8-phase output signal outputted from the phase-locked loop 310 to obtain a 16-phase output signal, wherein the phase difference between the phases of the 16-phase output signal is 10 ps.

The phase selector 340 selects a required phase from the 16-phase output signal of the interpolation circuit 320. The phase selected by the phase selector 340 is down-converted to an output signal OUT (for example, 1.6 GHz) by the divide-by-4 circuit 350 for the convenience of subsequent digital signal processing.

The multiplexer 330 outputs, for example, a 16-bit control signal according to the control signal CTL (such as 4 bits) to control the selection of the phase selector 340.

According to above embodiments of the present disclosure, the multi-phase generator including the capacitance phase interpolation circuit is capable of generating the required multi-phase output signal, and such design is still within the spirit of the present disclosure.

A capacitance phase interpolation method is disclosed in other embodiments of the present disclosure. Firstly, a plurality of reference clock signals are received by a first capacitance phase interpolation unit including a first capacitance group, wherein a plurality of capacitors in the first capacitance group are in a ring coupling. Interpolation is performed by the first capacitance phase interpolation unit and a second capacitance phase interpolation unit. Each of the output clock signals is obtained by performing phase interpolation on all the reference clock signals. The second capacitance phase interpolation unit is coupled to the first capacitance phase interpolation unit and includes a second capacitance group. A plurality of capacitors in the second capacitance group are in a ring coupling.

Besides, since the capacitor may filter noises, the capacitance phase interpolation circuit of the embodiments of the present disclosure is capable of eliminating noises and reducing interference.

As disclosed in above embodiments of the present disclosure, since the capacitors are in a ring coupling, each output clock signal is obtained by performing phase interpolation on all the reference clock signals, thus the phase interpolation is little affected by process variation and has higher phase precision, and may thus be used in multi-phase generation circuit requiring high precision.

For example, according to the related art, the output clock signal $P_1$ may be obtained by performing phase interpolation just on the reference clock signals $CLK_0$ and $CLK_1$. If process variation occurs to the capacitor 210c, the output clock signals $P_1$ obtained thereby may have offset. According to the embodiments of the present disclosure, each output clock signal is obtained by performing phase interpolation on all the reference clock signals. Even if the variation occurs to the capacitor 210c, each reference clock signal still may participate in the generation of the output clock signal $P_1$ via the ring coupling of capacitors. Therefore, the impact of process variation is lessened, and the offset of the output clock signal $P_1$ is reduced.

Besides, each of the capacitors 230a~230f of the second capacitance phase interpolation unit 230 is coupled between two relevant output points (for example, the capacitor 230a is coupled between output points $P_0$ and $P_1$), therefore the obtained output clock signal is related to the reference clocks no matter the output clock signal is obtained through interpolation or not. For example, even though generation of the output clock signal $P_0$ is not through interpolation while the output clock signal $P_1$ is an interpolation result of the first reference clock $CLK_0$ and the second reference clock $CLK_1$, the output clock signal P0 is still related to the reference clocks. This is the called self-calibration, which avoids the output signal are unsynchronized in high-frequency operation and reduces the phase offset caused by high-frequency effect. The phase offset will affect the precision of phase output.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A capacitance phase interpolation circuit, comprising:
    a first capacitance phase interpolation unit comprising a first capacitance group and receiving a plurality of reference clock signals, wherein a plurality of capacitors in the first capacitance group are in a ring coupling; and
    a second capacitance phase interpolation unit, coupled to the first capacitance phase interpolation unit and comprising a second capacitance group, wherein a plurality of capacitors in the second capacitance group are in a ring coupling;
    wherein each of output clock signals is obtained via the first capacitance phase interpolation unit and the second capacitance phase interpolation unit by performing phase interpolation on all the reference clock signals, and the first and second capacitance phase interpolation units do not include resistors.

2. The capacitance phase interpolation circuit according to claim 1, wherein the capacitors in the first capacitance group have equivalent capacitance.

3. The capacitance phase interpolation circuit according to claim 1, wherein the capacitors in the second capacitance group have equivalent capacitance.

4. The capacitance phase interpolation circuit according to claim 1, further comprising:
    a buffer unit coupled to the first capacitance phase interpolation unit and the second capacitance phase interpolation unit, the buffer unit comprising a plurality of phase inverters for adjusting respective levels of the output clock signals.

5. The capacitance phase interpolation circuit according to claim 4, wherein
    a first capacitor and a last capacitor in the first capacitance group of the first capacitance phase interpolation unit are coupled between a first reference clock signal and a last reference clock signals of the reference clock signals; and
    a second capacitor in the first capacitance group of the first capacitance phase interpolation unit is coupled between the first reference clock signal of the reference clock signals and a first phase inverter of the phase inverters.

6. The capacitance phase interpolation circuit according to claim 5, wherein at least a part of the capacitors in the first capacitance group of the first capacitance phase interpolation unit are serially coupled to each other.

7. The capacitance phase interpolation circuit according to claim 6, wherein each capacitor in the second capacitance group of the second capacitance phase interpolation unit is coupled between two adjacent phase inverters of the phase inverters.

8. The capacitance phase interpolation circuit according to claim 7, wherein all the capacitors in the second capacitance group of the second capacitance phase interpolation unit are serially coupled to each other.

9. The capacitance phase interpolation circuit according to claim 8, wherein
    a first capacitor and a last capacitor in the second capacitance group of the second capacitance phase interpolation unit are coupled to the second capacitor in the first capacitance group of the first capacitance phase interpolation unit and the first phase inverter of the phase inverters; and a second capacitor in the second capacitance group of the second capacitance phase interpolation unit is coupled to the first capacitor in the second capacitance group of the second capacitance phase interpolation unit, a third capacitor in the first capacitance group of the first capacitance phase interpolation unit, a fourth capacitor in the first capacitance group of the first capacitance phase interpolation unit and a second phase inverter of the phase inverters.

10. The capacitance phase interpolation circuit according to claim 1, wherein the reference clock signals are coupled to a first node via the first capacitance group of the first capacitance phase interpolation unit, and second and third output clock signals of the output clock signals are coupled to the first node via the second capacitance group of the second capacitance phase interpolation unit so as to obtain a first output clock signal of the output clock signals by performing phase interpolation on the first node.

11. A capacitance phase interpolation method, comprising:

receiving a plurality of reference clock signals by a first capacitance phase interpolation unit comprising a first capacitance group, wherein a plurality of capacitors in the first capacitance group are in a ring coupling; and performing interpolation by the first capacitance phase interpolation unit and a second capacitance phase interpolation unit which is coupled to the first capacitance phase interpolation unit and comprising a second capacitance group, wherein each of output clock signals is obtained by performing phase interpolation on all the reference clock signals, and a plurality of capacitors in the second capacitance group are in a ring coupling, and the first and second capacitance phase interpolation units do not include resistors.

12. The capacitance phase interpolation method according to claim 11, wherein the capacitors in the first capacitance group have equivalent capacitance.

13. The capacitance phase interpolation method according to claim 11, wherein the capacitors in the second capacitance group have equivalent capacitance.

14. The capacitance phase interpolation method according to claim 11, further comprising:

adjusting respective levels of the output clock signals by a buffer unit coupled to the first capacitance phase interpolation unit and the second capacitance phase interpolation unit, the buffer unit comprising a plurality of phase inverters.

15. The capacitance phase interpolation method according to claim 14, wherein at least a part of the capacitors in the first capacitance group of the first capacitance phase interpolation unit are serially coupled to each other.

16. The capacitance phase interpolation method according to claim 15, wherein each capacitor in the second capacitance group of the second capacitance phase interpolation unit is coupled between two adjacent phase inverters of the phase inverters.

17. The capacitance phase interpolation method according to claim 16, wherein all the capacitors in the second capacitance group of the second capacitance phase interpolation unit are serially coupled to each other.

18. The capacitance phase interpolation method according to claim 11, wherein the reference clock signals are coupled to a first node via the first capacitance group of the first capacitance phase interpolation unit, second and third output clock signals of the output clock signals are coupled to the first node via the second capacitance group of the second capacitance phase interpolation unit so as to obtain a first output clock signal of the output clock signals by performing phase interpolation on the first node.

* * * * *